US011456416B2

(12) United States Patent
Adusumilli et al.

(10) Patent No.: US 11,456,416 B2
(45) Date of Patent: Sep. 27, 2022

(54) RESISTIVE SWITCHING MEMORY CELL

(71) Applicant: International Business Machines Corporation, Armonk, NY (US)

(72) Inventors: Praneet Adusumilli, Somerset, NJ (US); Takashi Ando, Eastchester, NY (US); Reinaldo Vega, Mahopac, NY (US); Cheng Chi, Jersey City, NJ (US)

(73) Assignee: International Business Machines Corporation, Armonk, NY (US)

( * ) Notice: Subject to any disclaimer, the term of this patent is extended or adjusted under 35 U.S.C. 154(b) by 64 days.

(21) Appl. No.: 16/952,234

(22) Filed: Nov. 19, 2020

(65) Prior Publication Data
US 2022/0158092 A1     May 19, 2022

(51) Int. Cl.
| | |
|---|---|
| *H01L 45/00* | (2006.01) |
| *H01L 27/24* | (2006.01) |
| *G06N 3/08* | (2006.01) |

(52) U.S. Cl.
CPC ...... *H01L 45/1273* (2013.01); *H01L 27/2436* (2013.01); *H01L 45/08* (2013.01); *H01L 45/1233* (2013.01); *H01L 45/146* (2013.01); *H01L 45/165* (2013.01); *G06N 3/08* (2013.01)

(58) Field of Classification Search
CPC . H01L 45/1273; H01L 27/2536; H01L 45/08; H01L 45/1233; H01L 45/146; H01L 45/165
See application file for complete search history.

(56) References Cited

U.S. PATENT DOCUMENTS

| | | | |
|---|---|---|---|
| 9,034,689 B2 | 5/2015 | Sekar et al. | |
| 9,178,147 B2 | 11/2015 | Kuse et al. | |
| 9,515,262 B2 | 12/2016 | Wang et al. | |
| 10,381,557 B2 | 8/2019 | Wang et al. | |
| 2012/0295398 A1 | 11/2012 | Kurunczi | |
| 2015/0349250 A1 | 12/2015 | Chang | |
| 2018/0012657 A1 | 1/2018 | Shih | |
| 2019/0280203 A1* | 9/2019 | Grenouillet | ........... H01L 45/146 |
| 2020/0328350 A1* | 10/2020 | Yang | ................... H01L 45/1608 |
| 2021/0013095 A1* | 1/2021 | Tran | .................... H01L 27/2463 |
| 2021/0111339 A1* | 4/2021 | Chiu | .................... H01L 45/1233 |

FOREIGN PATENT DOCUMENTS

| | | |
|---|---|---|
| CN | 102254803 A | 11/2011 |
| CN | 106229407 A | 12/2016 |

OTHER PUBLICATIONS

Barias et al., Improvement of HfO2 based RRAM array performances by local Si implantation, 2017 IEEE International Electron Devices Meeting (IEDM), 2017, pp. 14.6.1-14.6.4 (Year: 2017).*

(Continued)

*Primary Examiner* — Shih Tsun A Chou
(74) *Attorney, Agent, or Firm* — Jeffrey M. Ingalls

(57) ABSTRACT

A resistive random access memory (ReRAM) device is provided. The ReRAM device includes a stack structure including a first electrode, a metal oxide layer in contact with the first electrode, and a second electrode in contact with the metal oxide layer. A portion of the stack structure is modified by ion implantation, and the modified portion of the stack structure is offset from edges of the stack structure.

12 Claims, 14 Drawing Sheets

(56) References Cited

OTHER PUBLICATIONS

Wu et al., "Negative differential resistance effect induced by metal ion implantation in SiO2 film for multilevel RRAM application", Nanotechnology, 29, Published Jan. 5, 2018, 7 pages.
Mahata et al., "Reversible nonvolatile and threshold switching characteristics in Cu/high-k/Si devices", IEICE Electronics Express, vol. 16, No. 16, Publicized Jul. 31, 2019, 4 pages.
You et al. "Engineering interface-type resistive switching in BiFeO 3 thin film switches by Ti implantation of bottom electrodes" Scientific Reports, 5, Published: Dec. 22, 2015, 9 pages.
Bartas et al., "Improvement of HfO2 based RRAM array performances by local Si implantation", 2017 IEEE International Electron Devices Meeting (IEDM), Jan. 25, 2018, 4 pages.
International Search Report and Written Opinion for Application PCT/CN2021/128430, dated Jan. 20, 2022, 9 pages.

\* cited by examiner

RESISTIVE SWITCHING MEMORY CELL

BACKGROUND

The present disclosure generally relates to fabrication methods and resulting structures for semiconductor based electronic devices. More specifically, the present disclosure relates to a resistive random access memory (ReRAM) cell structure having an integrated access transistor and a high density layout for neuromorphic computing, the ReRAM cell having reduced programming voltages.

ReRAM structures can be used as a type of non-volatile (NV) random-access memory (RAM) in computing resources. ReRAM devices having a simple metal-insulator-metal structure show promising characteristics in terms of scalability, low power operation, and multilevel data storage capability, and they may be suitable for next-generation memory applications. ReRAM typically operates by controlled changes in resistance across a dielectric solid-state material. The dielectric solid-state material may be referred to as a memristor. ReRAM may be considered as a promising technology for electronic synapse devices (or memristors) for neuromorphic computing as well as high-density and high-speed non-volatile memory applications. In neuromorphic computing applications, a resistive memory device can be used as a connection (synapse) between a pre-neuron and post-neuron, representing the connection weight in the form of device resistance. Multiple pre-neurons and post-neurons can be connected through a crossbar array of ReRAMs, which may enable a fully-connected neural network. Oxygen vacancies in a metal oxide layer of a ReRAM device are the building blocks of a current conducting filament.

SUMMARY

Embodiments of the present disclosure relate to a resistive random access memory (ReRAM) device. The ReRAM device includes a stack structure including a first electrode, a metal oxide layer in contact with the first electrode, and a second electrode in contact with the metal oxide layer. A portion of the stack structure is modified by ion implantation, and the modified portion of the stack structure is offset from edges of the stack structure.

Other embodiments relate to a method of fabricating a resistive random access memory (ReRAM) device. The method includes forming a stack structure by forming a first electrode, forming a metal oxide layer in contact with the first electrode, and forming a second electrode in contact with the metal oxide layer. A portion of the stack structure is modified by ion implantation, and the modified portion of the stack structure is offset from edges of the stack structure.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

DETAILED DESCRIPTION

Figure 1:
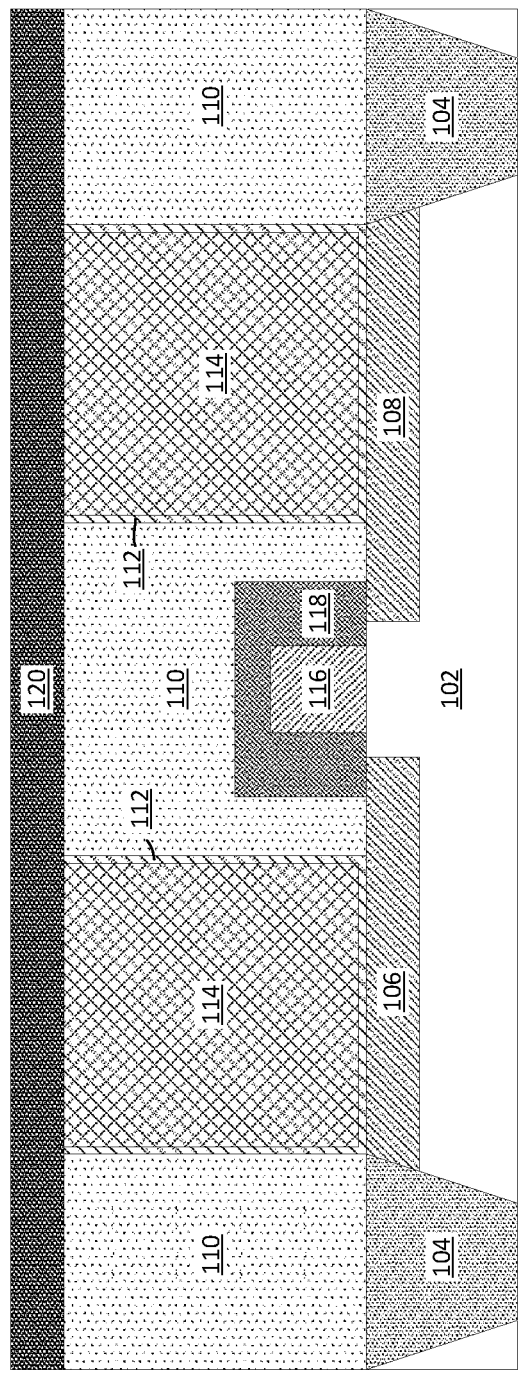
FIG. 1 is a cross-sectional view of a ReRAM device at an intermediate stage of the manufacturing process, according to embodiments.

The present disclosure generally relates to fabrication methods and resulting structures for semiconductor-based electronic devices. Certain embodiments relate to resistive random access memory (ReRAM) cell structures with an integrated access transistor and a high density layout that may be used in neuromorphic computing applications, and methods of fabricating such ReRAM devices. In particular, the present embodiments relate to a ReRAM device utilizing self-aligned and localized Si implantation through the top TiN layer into the metal oxide layer using a SiN spacer.

The flowcharts and cross-sectional diagrams in the Figures illustrate methods of manufacturing nanosheet ReRAM devices according to various embodiments. In some alternative implementations, the manufacturing steps may occur in a different order than that which is noted in the Figures, and certain additional manufacturing steps may be implemented between the steps noted in the Figures. Moreover, any of the layered structures depicted in the Figures may contain multiple sublayers.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to aspects of the present disclosure, in neuromorphic computing applications, a resistive memory device (e.g., a ReRAM device) can be used as a connection (synapse) between a pre-neuron and post-neuron, representing the connection weight in the form of device resistance.

Multiple pre-neurons and post-neurons can be connected through a crossbar array of RRAMs, which naturally expresses a fully-connected neural network.

A crossbar array of RRAM can be made with junction with resistively switching material formed on the bottom electrodes. The top electrodes are formed on the junction with resistively switching material to form a crossbar array of RRAMs.

Non-volatile resistively switching metal oxides, such as $HfO_x$, $TaO_x$, $AlO_x$, $ZrO_x$, $TiO_x$, or a combination of these materials are integrated into nano-crossbar arrays and nano-cross-points scaled down to a feature size by electron beam lithography. This enables a fast fabrication route for high density prototype test structures of passive memory cores with two terminal devices. The structures and the integrated material is electrically characterized to gain an insight into the general properties of nano-crossbar arrays with resistively switching metal oxides and to define the demands for an external CMOS control system.

Nonvolatile and resistively switching materials with two or more stable states such as $HfO_x$ are integrated as two terminal memory devices to efficiently create a ReRAM bit pattern. These cells can be integrated into crossbar arrays where it reduces the cell size per bit to four. The switching material can cover the whole chip area and every junction at a cross point is an addressable cell of a ReRAM. Since the array consists of passive elements, additional active external circuitry is required for the operation to address the cells, set, and reset their state and read the stored information.

Artificial neural networks (ANNs) can be formed from crossbar arrays of resistive processing units (RPUs) that provide local data storage and local data processing without the need for additional processing elements beyond the RPU. The trainable resistive crosspoint devices are referred to as RPUs.

The neurons are integrated in CMOS circuitry with cross bar array of devices, which stores a matrix. The input neurons, along with the hidden neuron layers and output neurons and input signals. The neurons states can be, for example, backward, forward and update.

Crossbar arrays (crosspoint arrays or crosswire arrays) are high density, low cost circuit architectures used to form a variety of electronic circuits and devices, including ANN architectures, neuromorphic microchips, and ultra-high density nonvolatile memory. A basic crossbar array configuration includes a set of conductive row wires and a set of conductive column wires formed to intersect the set of conductive row wires. The intersections between the two sets of wires are separated by so-called crosspoint devices, which may be formed from thin film material. Crosspoint devices, in effect, function as the ANN's weighted connections between neurons. Nanoscales two-terminal devices, for example memristors having conduction state switching characteristics, are often used as the crosspoint devices in order to emulate synaptic plasticity with high energy efficiency. The conduction state (e.g., resistance) of the memristive material may be altered by controlling the voltages applied between individual wires of the row and column wires.

The Resistive Processing Unit (RPU) can further enhance the functionality of neuromorphic computing. The new class of devices (RPU) that can be used as processing units to accelerate various algorithms including neural network training.

It may be desirable to form ReRAM cells without introducing damage in a perimeter area thereof. Moreover, it may be desirable to form ReRAM cells with a robust encapsulation to prevent oxygen penetration during the subsequent processes.

In certain of the present embodiments, in oxide ReRAM cell structures, the devices include a metal oxide layer positioned between a top electrode and a bottom electrode (i.e., a metal-insulator-metal structure). Oxygen vacancies in the metal oxide layer allow for the electroformation of a current conducting filament (CF) therein. In many ReRAM devices, the mechanism enabling the storage of information is based on the formation and rupture of this CF formed between the two electrodes, resulting in repeatable resistive switching between high resistance states (HRS) and low resistance states (LRS). With regard to the CF, when an oxide metal is sandwiched between two electrodes, when a sufficient positive voltage is applied to the top electrode, the CF will form between the two electrodes, resulting in a low resistance state. In contrast, when a sufficient negative voltage is applied to the bottom electrode, the CF breaks, resulting in a high resistance state. In certain embodiments of the oxide ReRAM device, the formation of the CF is triggered by field-assisted oxygen ion migrations, resulting in a change in the electronic conductivity (or resistivity) of the switching device, as discussed above. For oxide ReRAM devices, the electroforming of the CF is needed.

The process of forming the conductive filament may rely on a certain amount of randomness and the position of the created filament may not always be well controlled. This may result in the need for a higher forming voltage as the ReRAM cell is scaled, and this may lead to higher device variability. In certain ReRAM devices, Si implantation may be used after the post pillar reactive ion etching (RIE) process, and this may allow for a significant reduction in the CF forming voltage. However, to achieve this Si implantation, it may be required to use, and then later remove, a soft mask. These additional process steps may expose the $HfO_2$ of the metal oxide directly to additional plasma damage which may lead to additional device variability.

However, the present embodiments provide improved control of the distribution dynamics of the CF, and this may improve the reproducibility and stability (cycle-to-cycle) of the ReRAM device performance. In certain embodiments, a process flow and structure are provided to self-align and localize Si implantation through a top TiN layer into the metal oxide layer using a SiN spacer, and this process is performed without exposing the material (e.g., $HfO_2$) of the metal oxide layer to direct plasma damage. Moreover, the present embodiments may provide ReRAM devices with a robust encapsulation to prevent oxygen penetration during subsequent manufacturing process steps.

Referring now to the drawings in which like numerals represent the same or similar elements and initially to FIG. 1, this figure is a cross-sectional view of a ReRAM device in an intermediate stage of the manufacturing process, in accordance with certain embodiments. As shown in FIG. 1, the ReRAM device 100 includes a substrate 102. Shallow trench isolation (STI) regions 104 are formed into the substrate 102 and they function to isolate one transistor from another transistor. A source electrode 106 and a drain electrode 108 are formed and are doped areas of the silicon substrate 102. A gate electrode 116 is formed on the substrate 102 in a region between the source electrode 106 and the drain electrode 108. A dielectric spacer 118 is formed around the gate electrode 116. The dielectric spacer 118 may comprise SiN or any other suitable type of dielectric material. A first interlayer dielectric (ILD) layer 110 is formed on the substrate 102 over the STI regions 104, the source electrode 106, the drain electrode 108 and the dielectric spacer 118. Although not shown in FIG. 1, vias are first formed in the first ILD layer 110 to accommodate the formation of bottom contacts which include a via liner layer 112 and a via core 114. The via liner layer 112 may include TaN or TiN, or any other suitable material. The via core 114 may include, for example, W. After the formation of the bottom contacts, the ReRAM device 100 may be subjected to a chemical-mechanical planarization (CMP) to planarize the upper surface of the device. A first SiN layer 120 is then formed on the top of the first ILD layer 110 and the tops of the via cores 114.

Figure 2:
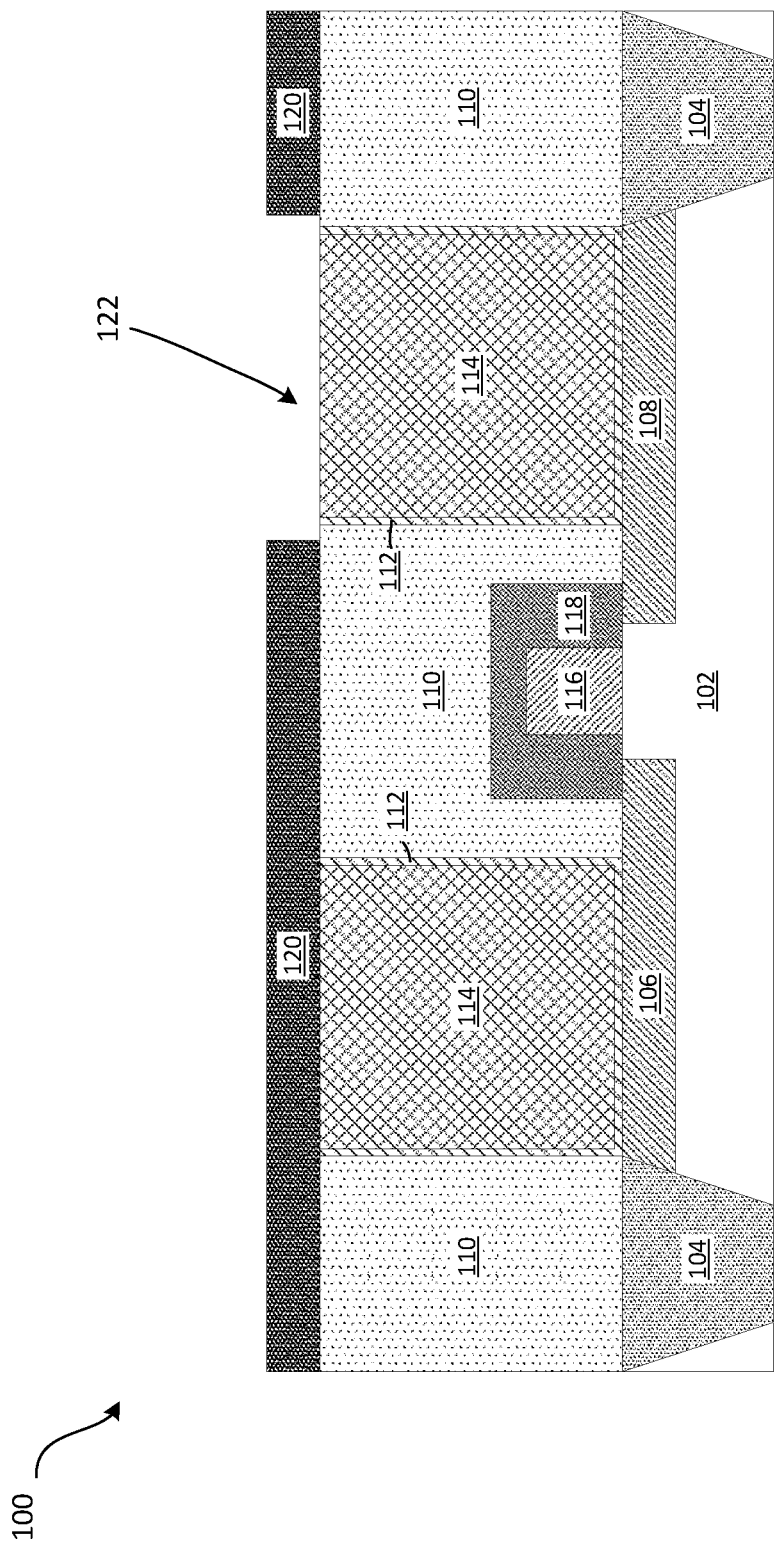
FIG. 2 is a cross-sectional view of the ReRAM device of FIG. 1 at a subsequent stage of the manufacturing process, according to embodiments.

Referring now to FIG. 2, this figure is a cross-sectional view of the ReRAM device 100 of FIG. 1 at a subsequent stage of the manufacturing process, according to embodiments. As shown in FIG. 2, a via opening 122 is formed into the first SiN layer 120. The via opening 122 may be formed by an RIE process or by any other suitable material removal process.

Figure 3:
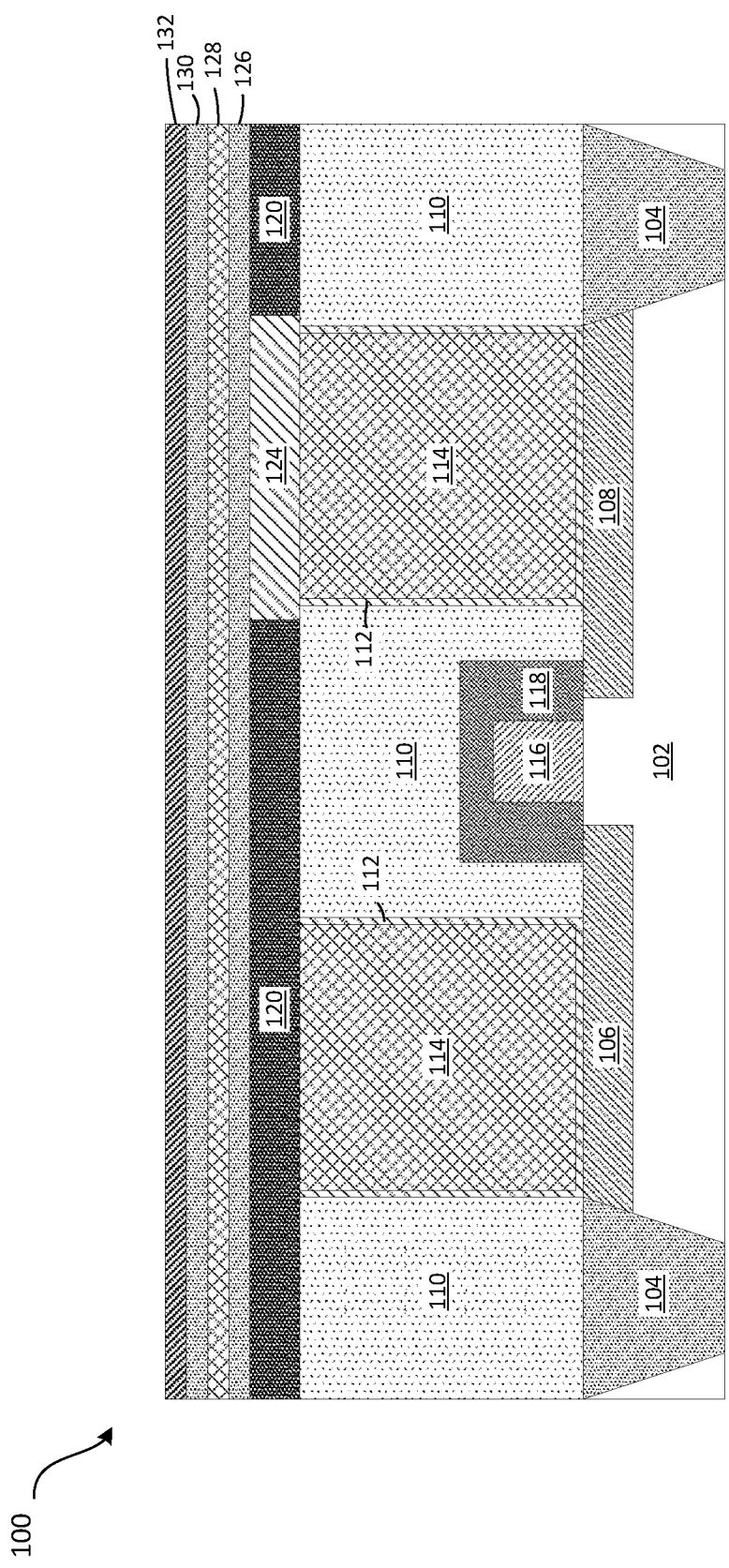
FIG. 3 is a cross-sectional view of the ReRAM device of FIG. 2 at a subsequent stage of the manufacturing process, according to embodiments.

Referring now to FIG. 3, this figure is a cross-sectional view of the ReRAM device of FIG. 2 at a subsequent stage of the manufacturing process, according to embodiments. As shown in FIG. 3, a liner layer 124 is formed to fill in the via opening 122. The liner layer 124 may comprise TiN or any other suitable material. The material of the liner layer 124 may be the same material as that of the via liner layer 112 described above with respect to FIG. 1, or it may be a different material. After the formation of the liner layer 124, the ReRAM device 100 may be subjected to a CMP process to planarize the structure.

As shown in FIG. 3, a ReRAM stack is formed over the device. First, a first electrode 126 (or a first stack liner layer) is formed over the entire ReRAM device 100. The first electrode 126 may be comprised of, for example, TiN. However, it should be appreciated that the first electrode 126 may be comprised of any other suitable material or combination of materials. Then, a metal oxide layer 128 is formed over the entire first electrode 126. The metal oxide layer 128 may comprise $HfO_2$, or any other suitable metal oxide material or combination of metal oxide materials. Then, a second electrode 130 (or second stack liner layer) is formed over the entire metal oxide layer 128. The second electrode 130 may comprise TiN (i.e., similar to the first electrode 126) or any other suitable material(s). A hardmask 132 is then deposed over the entire surface of the second electrode 130. The hardmask 132 may comprise SiN, or any other suitable material.

Figure 4:
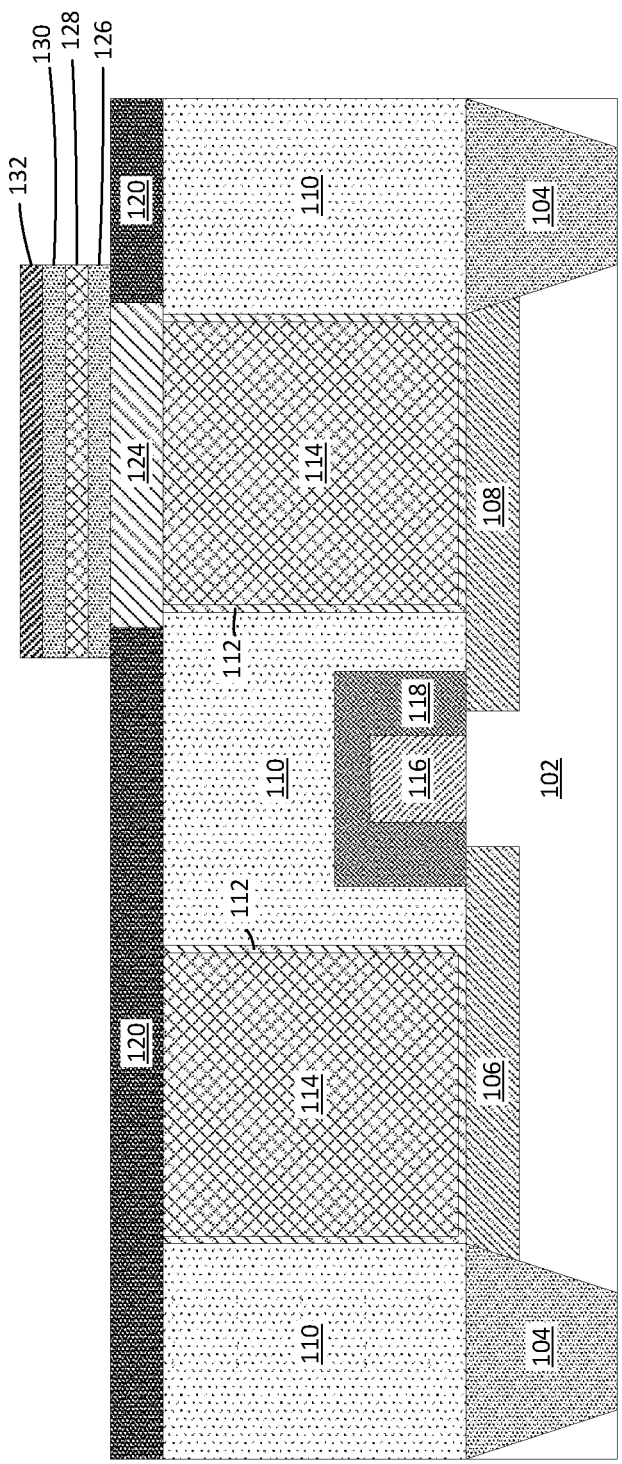
FIG. 4 is a cross-sectional view of the ReRAM device of FIG. 3 at a subsequent stage of the manufacturing process, according to embodiments.

Referring now to FIG. 4, this figure is a cross-sectional view of the ReRAM device 100 of FIG. 3 at a subsequent stage of the manufacturing process, according to embodiments. As shown in FIG. 4, etching is performed on the hardmask 132, the second electrode 130, the metal oxide layer 128, and the first electrode 126 to pattern these layers into a ReRAM pillar. In certain examples, for ease of manufacturing integration, the width of the hardmask 132, the second electrode 130, the metal oxide layer 128, and the first electrode 126 may be slightly larger than a width of the bottom contact structure (i.e., the via liner layer 112 and via core 114) to prevent inadvertent etching of the liner layer 124. In one example, the ReRAM pillar (or stack) includes a TiN first electrode 126, a $HfO_2$ metal oxide layer 128, and a TEC TiN second electrode 130.

Figure 5:
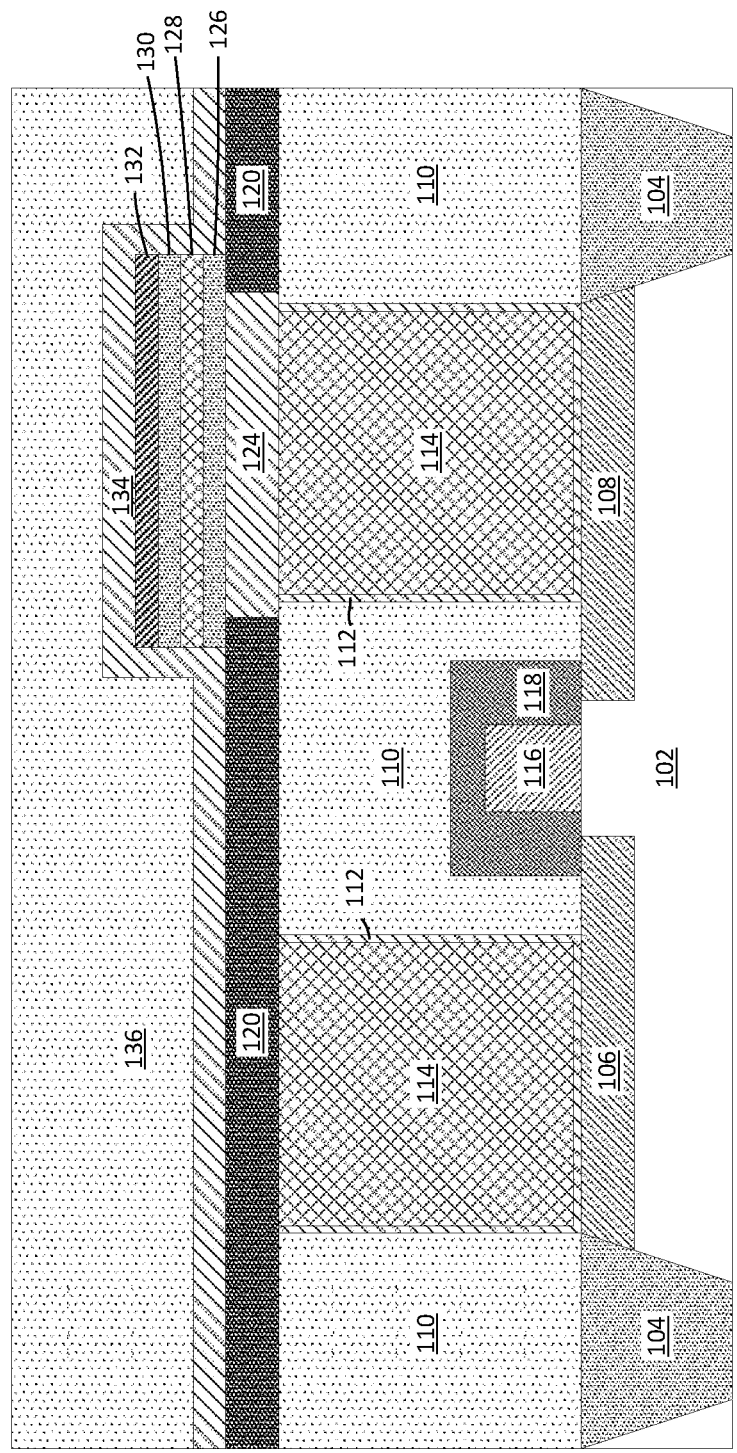
FIG. 5 is a cross-sectional view of the ReRAM device of FIG. 4 at a subsequent stage of the manufacturing process, according to embodiments.

Referring now to FIG. 5, this figure is a cross-sectional view of the ReRAM device of FIG. 5 at a subsequent stage of the manufacturing process, according to embodiments. As shown in FIG. 5, an encapsulation layer 134 is formed over the entire surface of the ReRAM device 100. The encapsulation layer 134 may comprise, for example, SiN, or any other suitable material. Then, a second ILD layer 136 may be deposited over the entire surface of the encapsulation layer 134. The second ILD layer 136 may comprise $SiO_2$ or any other suitable dielectric material. In certain embodiments, following the formation of the second ILD layer 136, the ReRAM device 100 is subjected to a CMP process to planarize the surface of the device.

Figure 6:
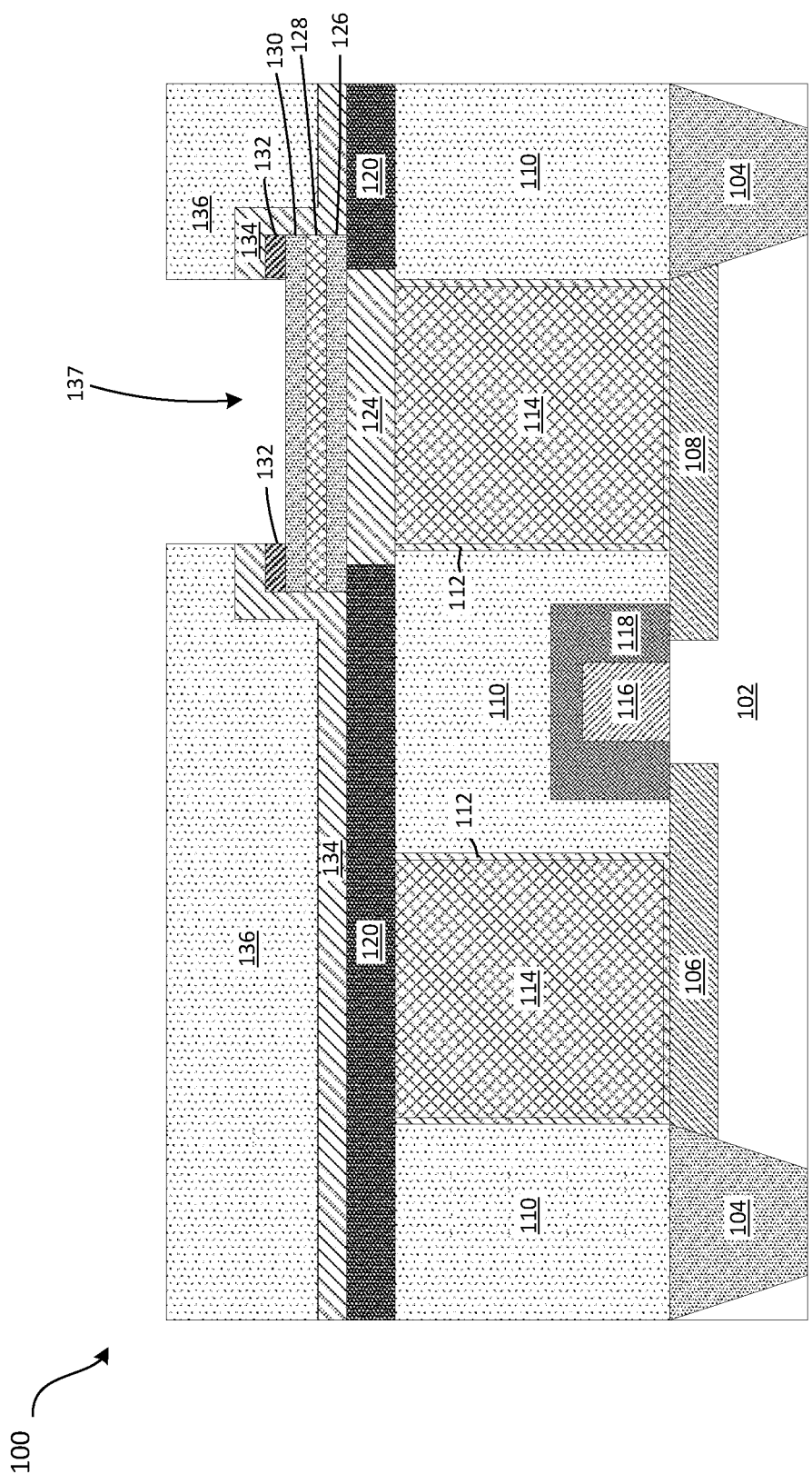
FIG. 6 is a cross-sectional view of the ReRAM device of FIG. 5 at a subsequent stage of the manufacturing process, according to embodiments.

Referring now to FIG. 6, this figure is a cross-sectional view of the ReRAM device of FIG. 5 at a subsequent stage of the manufacturing process, according to embodiments. As shown in FIG. 6, a contact via 137 is formed by etching through the second ILD layer 136, the encapsulation layer 134 and the hardmask 132. The contact via 137 may accommodate the formation of the top electrode.

Figure 7:
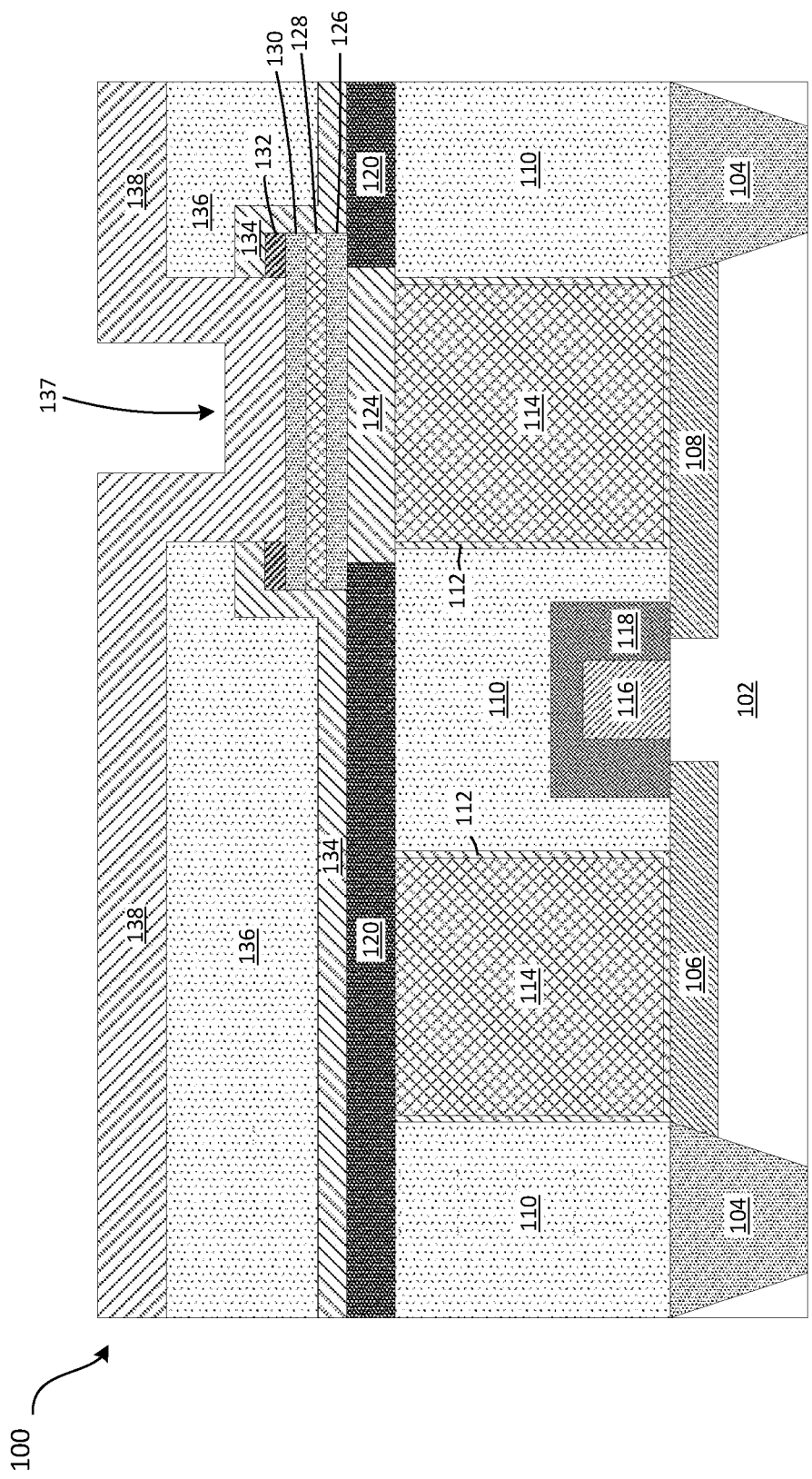
FIG. 7 is a cross-sectional view of the ReRAM device of FIG. 6 at a subsequent stage of the manufacturing process, according to embodiments.

Referring now to FIG. 7, this figure is a cross-sectional view of the ReRAM device of FIG. 6 at a subsequent stage of the manufacturing process, according to embodiments. As shown in FIG. 7, a spacer layer 138 is deposited after the contact via 137 opening step described above with respect to FIG. 6. In one example, the spacer layer 138 is comprised of SiN. However, it should be appreciated that other materials or combination of materials may be used.

Figure 8:
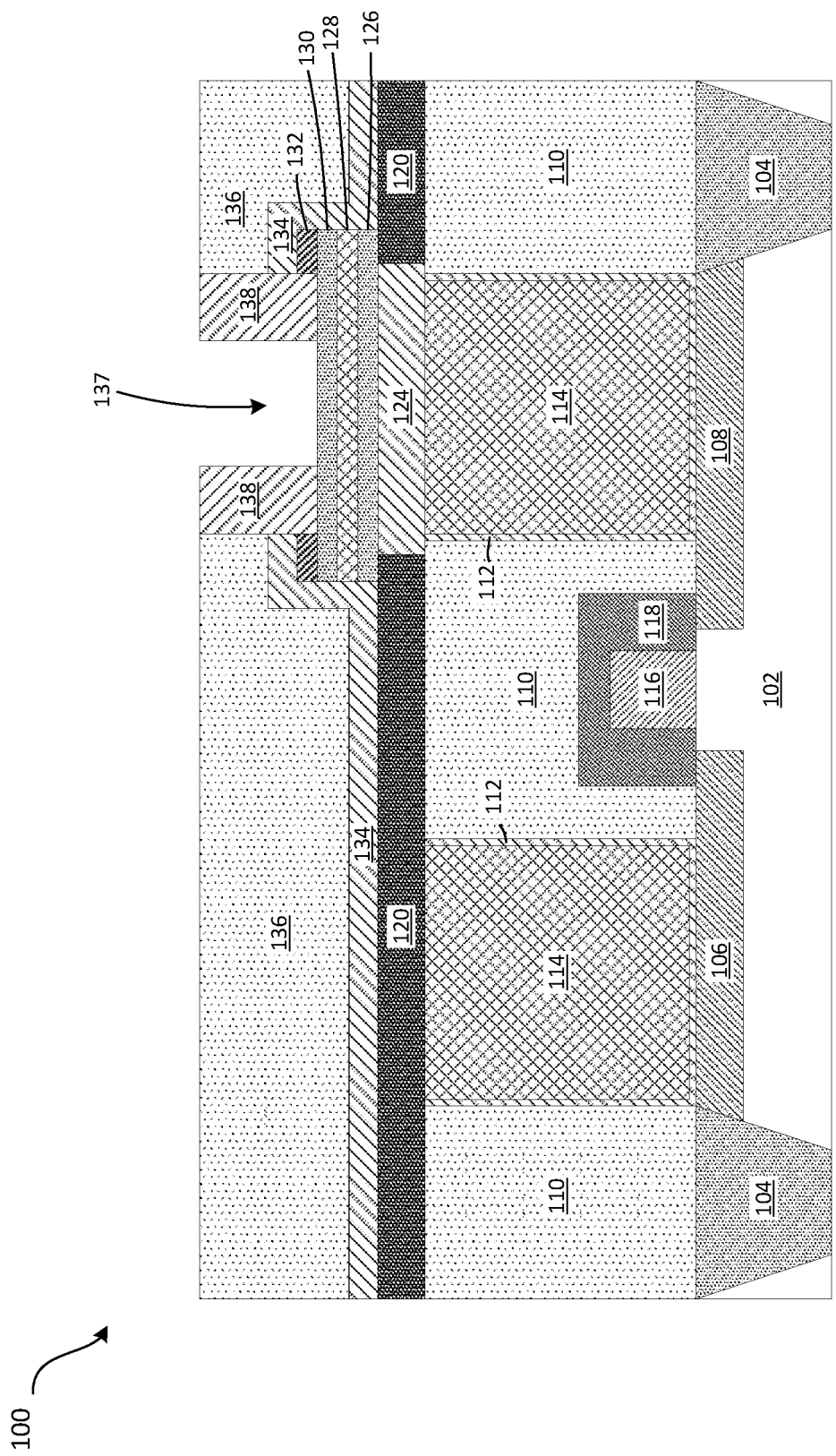
FIG. 8 is a cross-sectional view of the ReRAM device of FIG. 7 at a subsequent stage of the manufacturing process, according to embodiments.

Referring now to FIG. 8, this figure is a cross-sectional view of the ReRAM device of FIG. 7 at a subsequent stage of the manufacturing process, according to embodiments. As shown in FIG. 7, a reactive ion etching (RIE) process is performed to remove portions of the spacer layer. It should be appreciated that other material removal processes such as inductively coupled plasma (ICP) may be used as an alternative to RIE. Thus, as shown in FIG. 7, portions of the spacer layer 138 on top of the second ILD layer 136 are removed. Also, portions of the spacer layer 138 on top of the second electrode 130 have been removed. Thus, the only remaining portions of the spacer layer 138 is a vertical portion thereof on the sidewalls of the hardmask 132, on the sidewalls of the encapsulation layer 134, and on the sidewalls of the second ILD layer 136. Because there is a certain thickness of the spacer layer 138, portions of the ReRAM stack (i.e., the first electrode 126, the metal oxide layer 128 and the second electrode 130) are covered by the spacer layer 138. Thus, this spacer layer 138 will block portions of the ReRAM stack during subsequent Si ion implantation processes, and thus confine the ion implantation to a specific area of the ReRAM stack that is not covered by the spacer layer 138.

Figure 9:
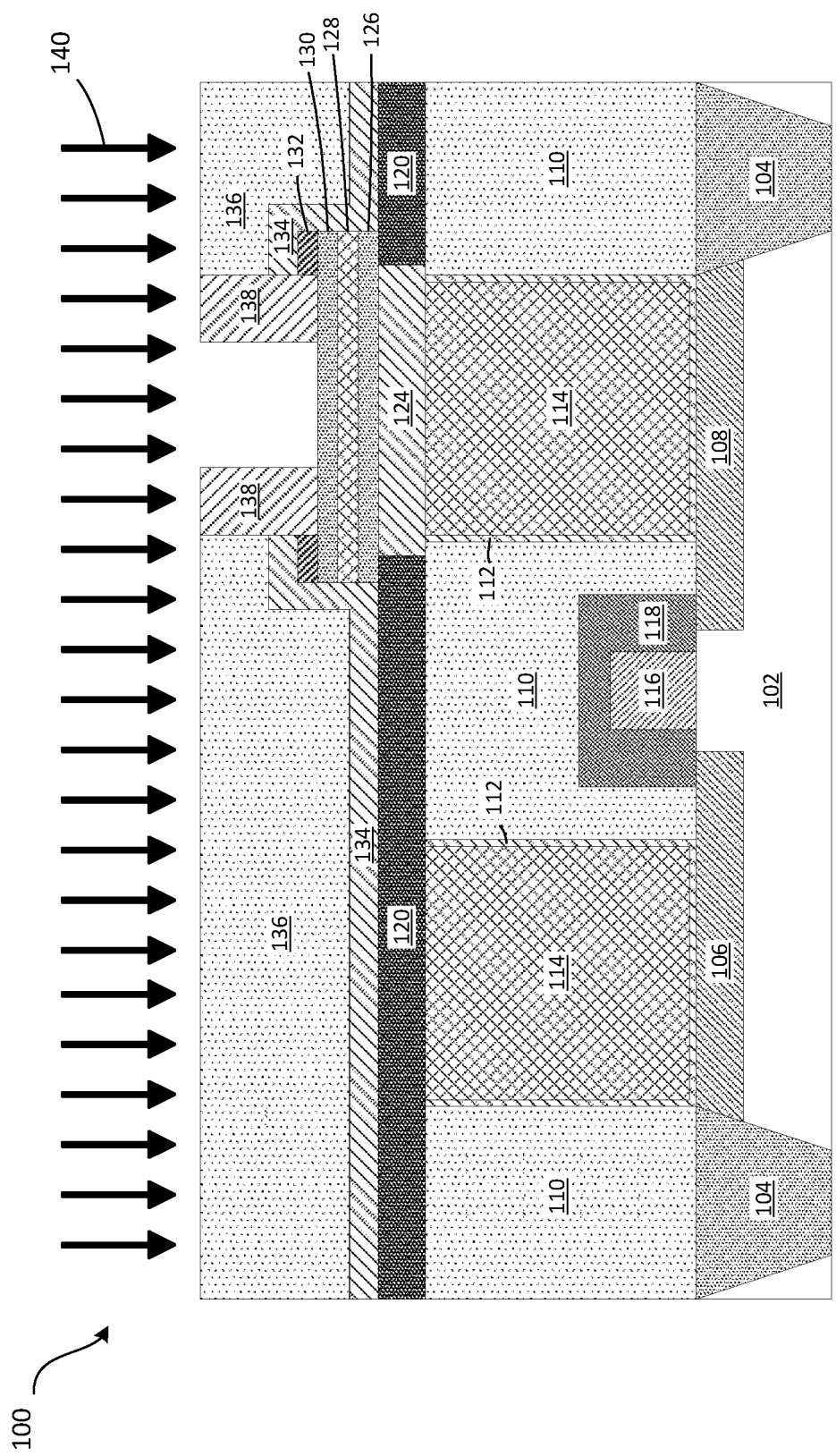
FIG. 9 is a cross-sectional view of the ReRAM device of FIG. 8 at a subsequent stage of the manufacturing process, according to embodiments.

Referring now to FIG. 9, this figure is a cross-sectional view of the ReRAM device of FIG. 8 at a subsequent stage of the manufacturing process, according to embodiments. As shown in FIG. 9, using the second ILD layer 136 and the spacer layer 138 as a mask, blanket Si ion implantation 140 is performed over the entire surface of the ReRAM device 100.

Figure 10:
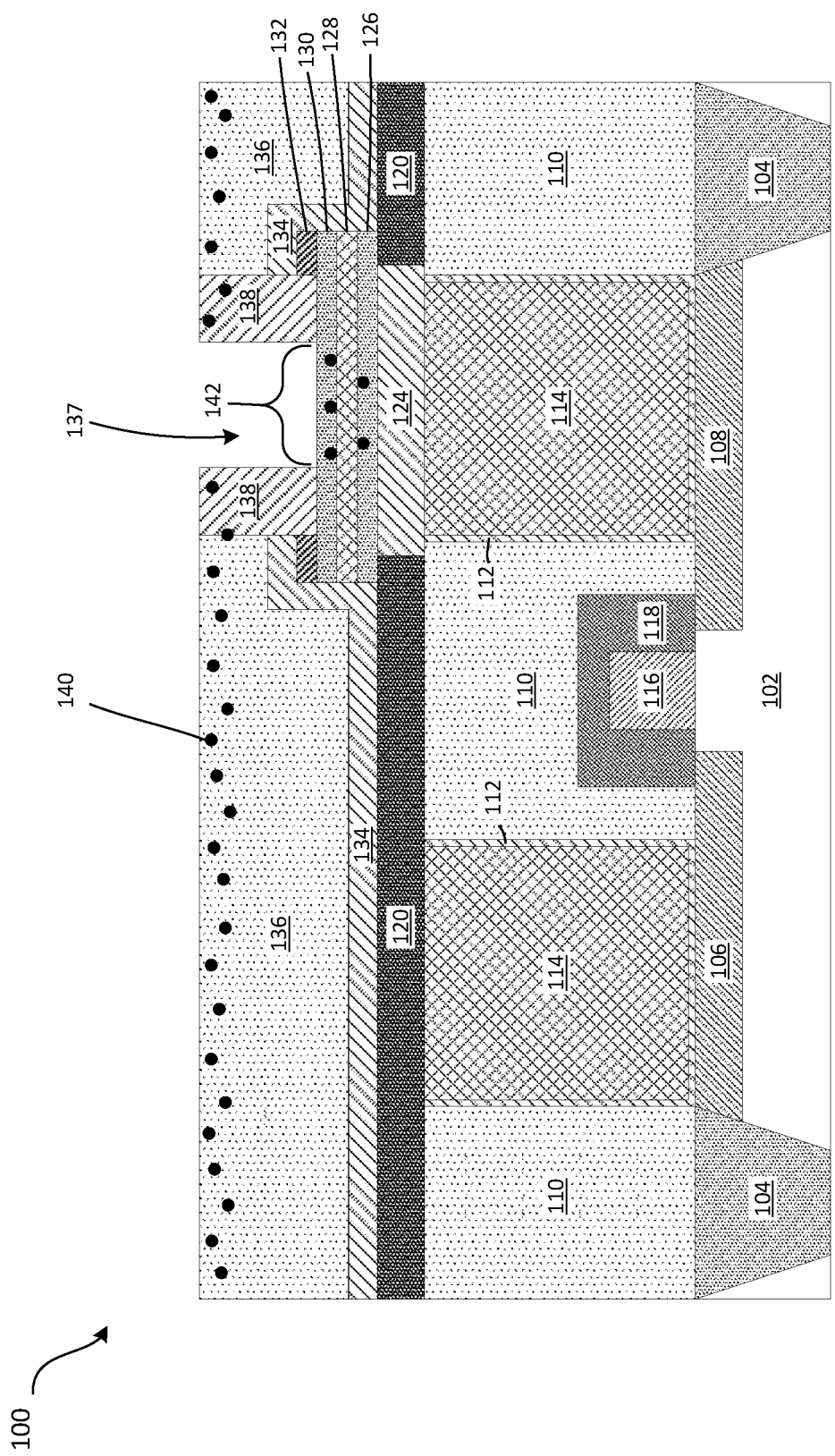
FIG. 10 is a cross-sectional view of the ReRAM device of FIG. 9 at a subsequent stage of the manufacturing process, according to embodiments.

Referring now to FIG. 10, this figure is a cross-sectional view of the ReRAM device of FIG. 9 at a subsequent stage of the manufacturing process, according to embodiments. As shown in FIG. 10, the ion implantation 140 process is complete. Because this is a blanket implantation, the ions are distributed in not only the ReRAM stack (i.e., the first electrode 126, the metal oxide layer 128 and the second electrode 130), but also in upper portions of the spacer layer 138 and the second ILD layer 136. However, only a confined area (i.e., a modified portion 142) of the ReRAM stack is affected by the Si ion implantation 140. In other words, a width of the modified portion of the stack structure is less than a width of the stack structure. Thus, because the spacer layer 138 is formed on the upper and outer portions of the ReRAM stack, this ion implantation 140 is a self-aligned process. Because this is a self-aligned process, the Si ion implantation 140 is away from the RIE damage on the ReRAM pillar sidewall, which may improve the device-to-device variability. The spacer layer 138 may also have the effect of reducing the active region of the device. That is, because the ion implantation 140 in the ReRAM pillar is localized away from the edges of the pillar, the conductive filament (CF) will also be formed away from the edge of the pillar (i.e., the location of the CF will be more confined to the middle of the pillar). It should be appreciated that the energy and dosage of the ion implantation 140 may be chosen appropriately for a through TE implant to occur. Thus, according to the present embodiments, a resistive switching ReRAM memory cell is provided with a pillar stack structure having localized ion implantation, resulting in reduced programming voltages.

Figure 11:
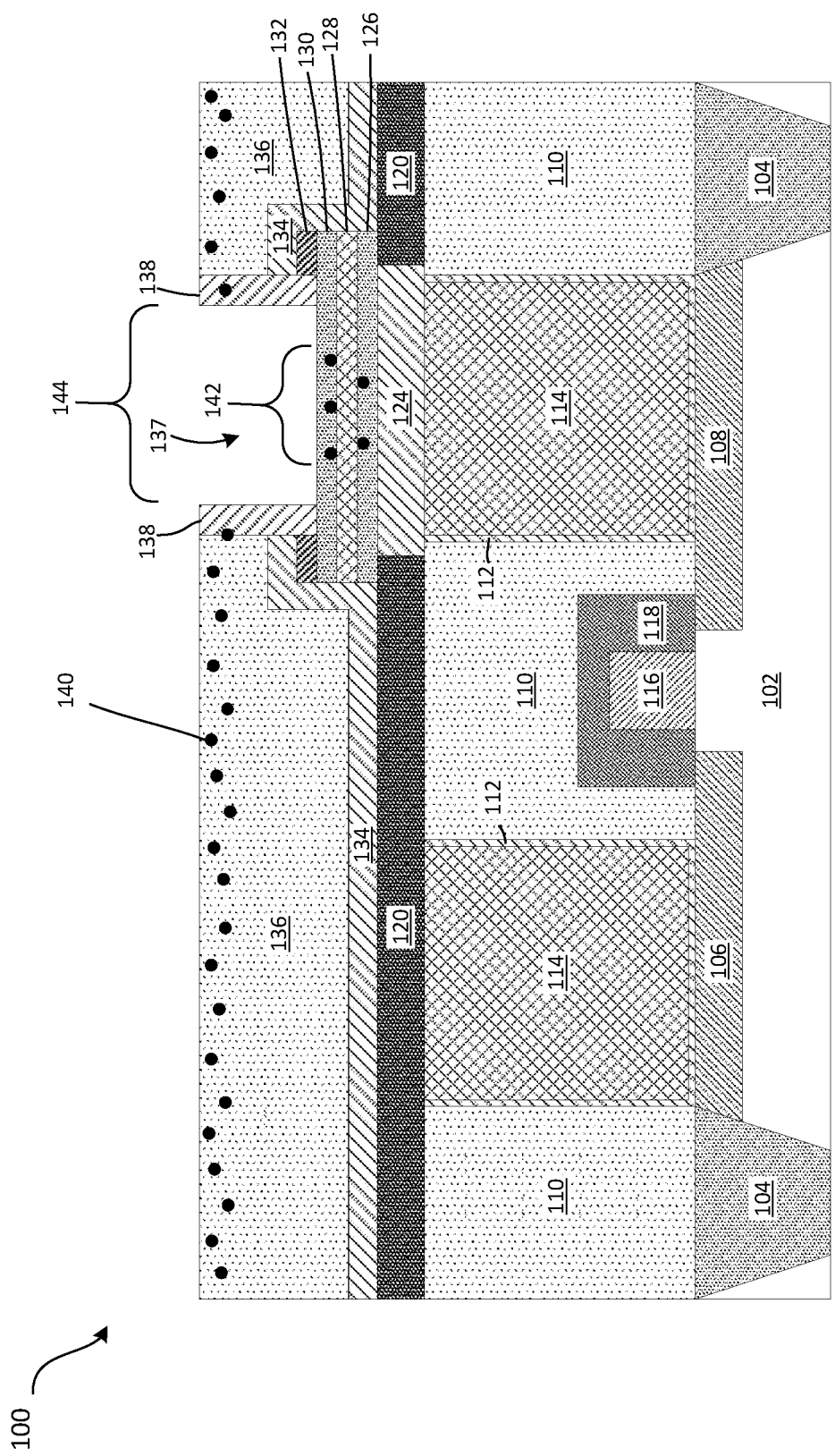
FIG. 11 is a cross-sectional view of the ReRAM device of FIG. 10 at a subsequent stage of the manufacturing process, according to embodiments.

Referring now to FIG. 11, this figure is a cross-sectional view of the ReRAM device of FIG. 10 at a subsequent stage of the manufacturing process, according to embodiments. As shown in FIG. 11, a wet etch may be performed to thin down the spacer layer 138 prior to forming the metal upper electrode. In particular, as shown in FIG. 11, due to the thinning of the spacer layer 138, a final width 144 of the via is greater than the width of the modified portion 142. In other words, a distance between opposed inner sidewall surfaces of the sidewall spacer (i.e., the spacer layer 138) is greater than a width of the modified portion of the stack structure (i.e., the ReRAM stack). This may allow for building a wider upper electrode.

Figure 12:
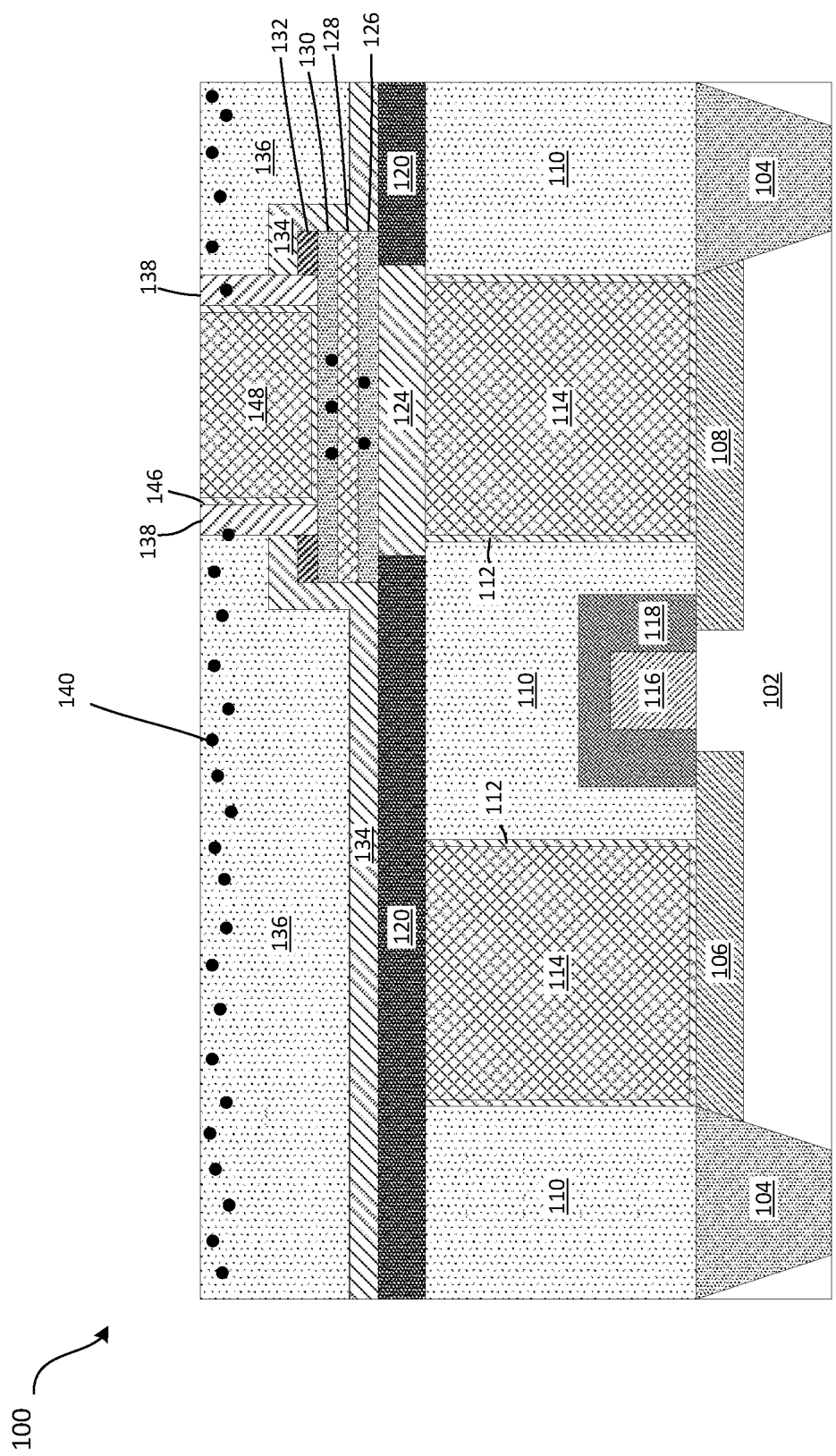
FIG. 12 is a cross-sectional view of the ReRAM device of FIG. 11 at a subsequent stage of the manufacturing process, according to embodiments.

Referring now to FIG. 12, this figure is a cross-sectional view of the ReRAM device of FIG. 11 at a subsequent stage of the manufacturing process, according to embodiments. As shown in FIG. 12, the top electrode includes a top electrode via liner layer 146 and a top electrode via core 148. The top electrode via liner layer 146 may include TaN or TiN, or any other suitable material. The top electrode via core 148 may include, for example, W. After the formation of the top electrode, the ReRAM device 100 may be subjected to a chemical-mechanical planarization (CMP) to planarize the upper surface of the device.

Figure 13:
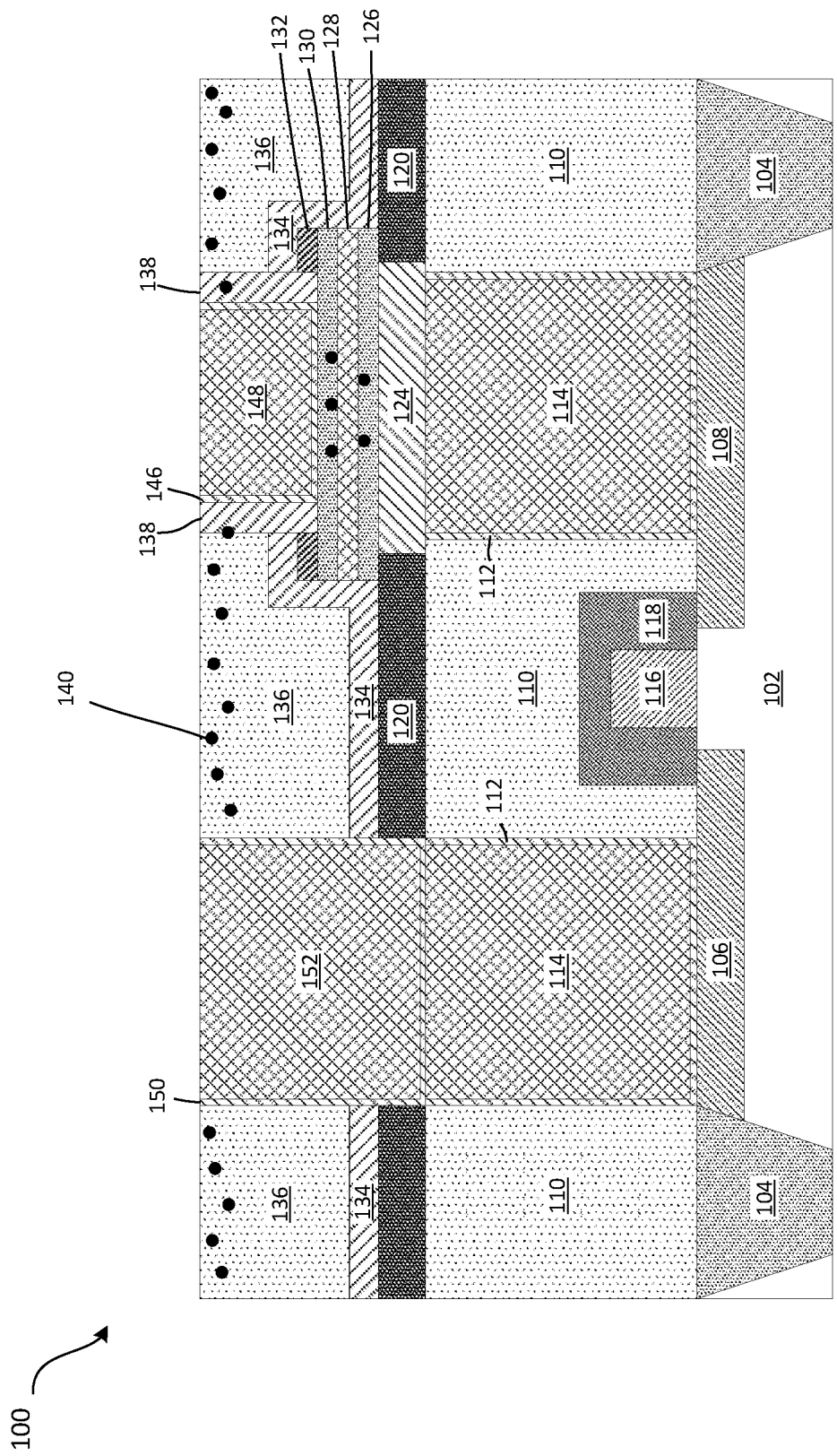
FIG. 13 is a cross-sectional view of the ReRAM device of FIG. 12 at a subsequent stage of the manufacturing process, according to embodiments.

Referring now to FIG. 13, this figure is a cross-sectional view of the ReRAM device of FIG. 12 at a subsequent stage of the manufacturing process, according to embodiments. Although not shown in FIG. 13, a periphery contact via is formed by etching through the second ILD layer 136, the encapsulation layer 134 and the first SiN layer 120 to expose the left side via core 114.

Figure 14:
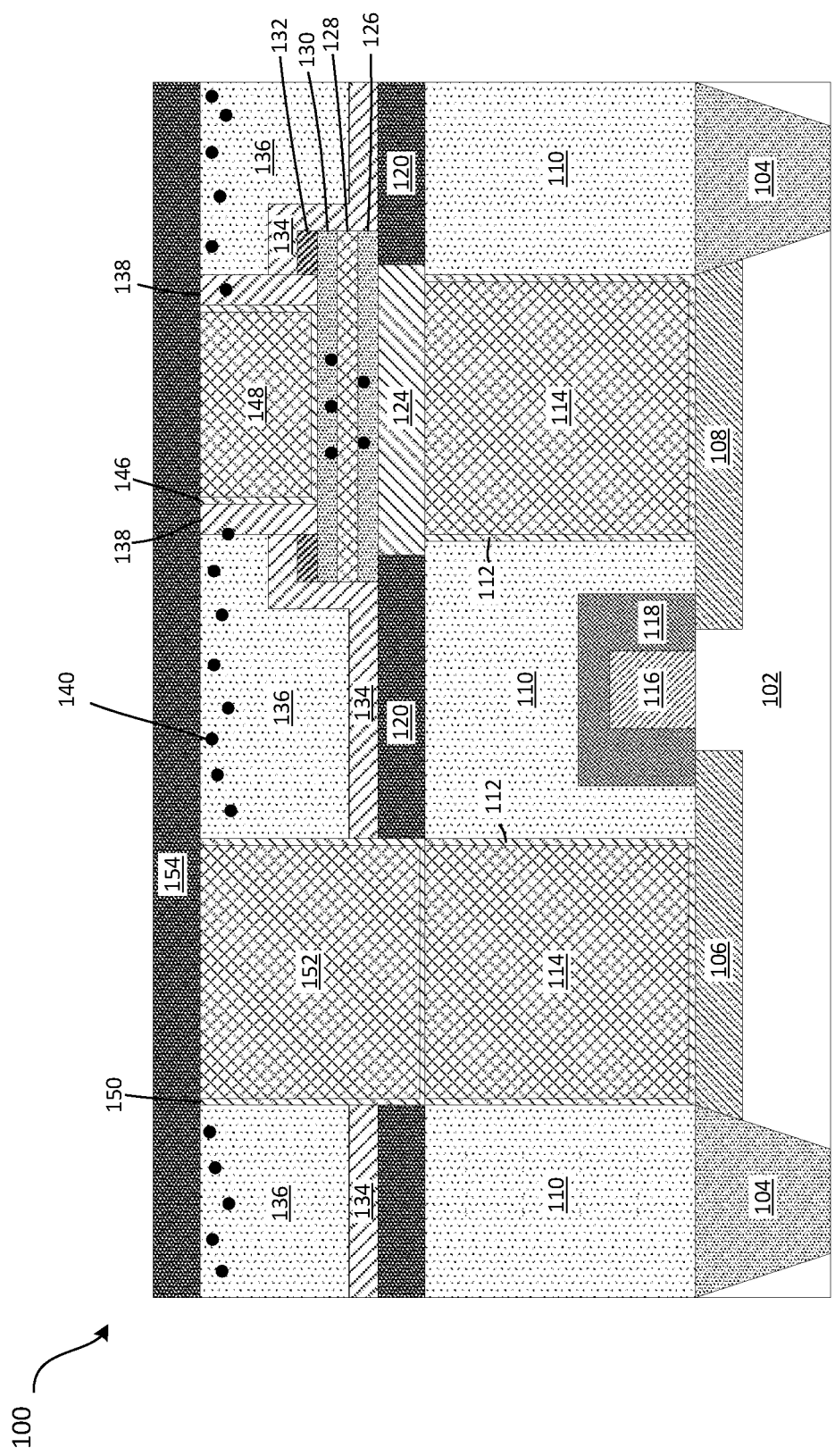
FIG. 14 is a cross-sectional view of the ReRAM device of FIG. 13 at a subsequent stage of the manufacturing process, according to embodiments.

Referring now to FIG. 14, this figure is a cross-sectional view of the ReRAM device of FIG. 13 at a subsequent stage of the manufacturing process, according to embodiments. As shown in FIG. 14, after the formation of the periphery contact via, a periphery contact via liner layer 150 is deposited The periphery contact via liner layer 150 may include TaN or TiN, or any other suitable material. The periphery contact via core 152 is then formed and may include, for example, W. After the formation of the periphery contact via liner layer 150 and the periphery contact via core 152, a second SiN layer 154 is formed to cover the upper surface of the periphery contact via core 152. Then, in certain examples, the ReRAM device 100 may be subjected to a chemical-mechanical planarization (CMP) to planarize the upper surface of the device. In certain embodiments, additional higher level metallization layers may be formed.

Therefore, in the present embodiments, a ReRAM device structure may be formed where a localized portion of the dielectric metal oxide layer 128, the bottom electrode 126 and the top electrode 130 are modified by implantation. In these embodiments, the implant modified portion of the ReRAM device 100 is away from the edge of the pillar structure. In certain embodiments, the metal oxides may include $HfO_2$, $Ta_2O_5$, $ZrO_2$, $TiO_2$, $Al_2O_3$ and mixtures thereof. The top electrode 130 and the bottom electrode 126 may consist of, for example, TiN or TaN. Implant species may include Si, Al, Hf, Zr, Ti and Ta or a combination of these elements. In certain embodiments, the via contact (i.e., the upper electrode via liner layer 146 and the upper electrode via core 148) to the ReRAM device 100 may be in contact with a spacer layer 138 (i.e., sidewall spacer).

Also, in certain embodiments, a method of manufacturing a ReRAM device 100 (i.e., where the dielectric metal oxide layer, and the top and bottom electrodes are modified by ion implantation) includes creating a via opening, then depositing a SiN spacer layer by CVD or PECVD, followed by etching a ICP based spacer via RIE etching to self-align and localize the implantation. The blanked ion beam-based line-of-sight implantation is performed through the top electrode TiN contact without the use of a soft mask. Moreover, in certain embodiments, a SiN wet etch is performed to thin down the spacer on the via sidewall to optimize/maximize the via contact area, and this is followed by metallization and CMP.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A resistive random access memory (ReRAM) device comprising:
    a stack structure including
        a first electrode,
        a metal oxide layer in contact with the first electrode, and
        a second electrode in contact with the metal oxide layer,
    an interlayer dielectric (ILD) layer formed on the stack structure, the ILD layer having a via formed therein;
    a sidewall spacer formed on the second electrode that fills side portions of the via; and
    a second electrode contact structure formed on the second electrode between opposed inner sidewall surfaces of the sidewall spacer,
    wherein a portion of the stack structure is modified by ion implantation, and a modified portion of the stack structure has a width that is less than a width of the second electrode contact structure and less than a width of the stack structure.

2. The ReRAM device of claim 1, wherein the metal oxide layer comprises at least one selected from the group consisting of $HfO_2$, $Ta_2O_5$, $ZrO_2$, $TiO_2$, and $Al_2O_3$.

3. The ReRAM device of claim 1, wherein the spacer layer comprises SiN.

4. The ReRAM device of claim 1, wherein the first electrode and the second electrode include TiN.

5. The ReRAM device of claim 1, wherein a distance between the opposed inner sidewall surfaces of the sidewall spacer is greater than the width of the modified portion of the stack structure.

6. The ReRAM device of claim 1, wherein an implant species for the ion implantation of the stack structure is at least one selected from the group consisting of Si, Al, Hf, Zr, Ti and Ta.

7. A method of fabricating a resistive random access memory (ReRAM) device, the method comprising:
    forming a stack structure by
        forming a first electrode,
        forming a metal oxide layer in contact with the first electrode, and
        forming a second electrode in contact with the metal oxide layer,
    forming an interlayer dielectric (ILD) layer on the stack structure, and forming a via in the ILD layer;
    forming a sidewall spacer on the second electrode that fills side portions of the via; and
    forming a second electrode contact structure on the second electrode between opposed inner sidewall surfaces of the sidewall spacer,
    wherein a portion of the stack structure is modified by ion implantation, and a modified portion of the stack structure has a width that is less than a width of the second electrode contact structure and less than a width of the stack structure.

8. The method of fabricating the ReRAM device of claim 7, wherein the metal oxide layer comprises at least one selected from the group consisting of $HfO_2$, $Ta_2O_5$, $ZrO_2$, $TiO_2$, $Al_2O_3$.

9. The method of fabricating the ReRAM device of claim 7, wherein the spacer layer comprises SiN.

10. The method of fabricating the ReRAM device of claim 7, wherein the first electrode and the second electrode include TiN.

11. The method of fabricating the ReRAM device of claim 7, wherein a distance between the opposed inner sidewall surfaces of the sidewall spacer is greater than the width of the modified portion of the stack structure.

12. The method of fabricating the ReRAM device of claim 7, wherein an implant species for the ion implantation of the stack structure is at least one selected from the group consisting of Si, Al, Hf, Zr, Ti and Ta.

* * * * *